United States Patent
Fukumoto et al.

(10) Patent No.: US 6,777,798 B2
(45) Date of Patent: Aug. 17, 2004

(54) STACKED SEMICONDUCTOR DEVICE STRUCTURE

(75) Inventors: Takakazu Fukumoto, Tokyo (JP);
 Muneharu Tokunaga, Tokyo (JP);
 Tetsuya Matsuura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/377,639

(22) Filed: Mar. 4, 2003

(65) Prior Publication Data

US 2003/0127729 A1 Jul. 10, 2003

Related U.S. Application Data

(63) Continuation of application No. 09/947,360, filed on Sep. 7, 2001.

(30) Foreign Application Priority Data

Feb. 5, 2001 (JP) ........................................ P2001-28202
Mar. 5, 2001 (JP) ........................................ P2001-60003

(51) Int. Cl.$^7$ ............................................. H01L 23/02
(52) U.S. Cl. ...................... 257/686; 257/723; 257/724
(58) Field of Search ................................ 257/686, 723, 257/724

(56) References Cited

U.S. PATENT DOCUMENTS

| | | | |
|---|---|---|---|
| 5,570,274 A | 10/1996 | Saito et al. | |
| 5,744,862 A | 4/1998 | Ishii | |
| 5,982,026 A | * 11/1999 | Tsunoda | 257/666 |
| 6,038,132 A | 3/2000 | Tokunaga et al. | |
| 6,160,718 A | 12/2000 | Vakilian | |

FOREIGN PATENT DOCUMENTS

| | | |
|---|---|---|
| JP | 63-073694 | 4/1988 |
| JP | 63-114245 | 5/1988 |
| JP | 02-134890 | 5/1990 |
| JP | 04-276649 | 10/1992 |
| JP | 06-177501 | 6/1994 |
| JP | 06-314885 | 11/1994 |
| JP | 06-334294 | 12/1994 |
| JP | 07-022727 | 1/1995 |
| JP | 8-153747 | 6/1996 |
| JP | 9-121017 | 5/1997 |
| JP | 9-252083 | 9/1997 |
| JP | 09-270575 A | 10/1997 |
| JP | 10-173122 | 6/1998 |
| JP | 11-40745 | 2/1999 |
| JP | 11-214611 A | 8/1999 |
| JP | 2000-124400 A | 4/2000 |
| JP | 2000-156460 | 6/2000 |
| JP | 2000-156465 A | 6/2000 |
| JP | 2000-252419 A | 9/2000 |
| JP | 2000-307055 A | 11/2000 |
| JP | 2001-68594 | 3/2001 |

* cited by examiner

*Primary Examiner*—Kammie Cuneo
*Assistant Examiner*—Asok Kumar Sarkar
(74) *Attorney, Agent, or Firm*—McDermott Will & Emery LLP

(57) ABSTRACT

A stacked semiconductor device structure comprising: a plurality of semiconductor modules each of which includes a substrate and at least one semiconductor device mounted on the substrate; a stacking device for stacking the semiconductor modules on one another; and a surface mount device for surface mounting on a further substrate for a system appliance the semiconductor modules stacked on one another by the stacking device.

7 Claims, 22 Drawing Sheets

STACKED SEMICONDUCTOR DEVICE STRUCTURE

This application is a continuation of application Ser. No. 09/947,360, filed Sep. 7, 2001.

BACKGROUND OF THE INVENTION

1. Field of the Invention

The present invention relates to a surface mount type stacked semiconductor device structure including a plurality of semiconductor devices each having a package and an outer lead, in which space for mounting the semiconductor devices on a system appliance can be reduced and capacity of the semiconductor devices can be increased.

2. Description of the Prior Art

Hereinafter, four examples of prior art memory modules in which their capacities are made twice are described with reference to FIGS. 28 to 31, respectively. Firstly, in a prior art memory module 130 shown in FIG. 28, a semiconductor device 132 formed by an ordinary single chip is mounted on each of opposite faces of a printed wiring board 133 by outer leads 132a extending straight horizontally from opposite sides of the semiconductor device 132. The memory module 130 is mounted on a substrate 120 for a system appliance by solder balls 39 provided on a lower face of the printed wiring board 133.

Secondly, in a conventional memory module 140 shown in FIG. 29, two packages 142 each having gull wing outer leads or L type outer leads 144 are stacked on each other through a small connecting substrate 143. By soldering the L type outer lead 144 of the lower package 142 to the substrate 120 for the system appliance, the memory module 140 is mounted on the substrate 120 for the system appliance.

Thirdly, in a known memory module 150 shown in FIG. 30, L type outer leads 153 of a lower package 152 and outer leads 155 of an upper package 154 are directly connected to each other. By soldering the L type outer leads 153 of the lower package 152 to the substrate 120 for the system appliance, the memory module 150 is mounted on the substrate 120 for the system appliance.

Fourthly, in a prior art memory module 160 shown in FIG. 31, two semiconductor chips 163 are stacked on each other in a resinous package 162. By soldering L type outer leads 164 of the resinous package 162 to the substrate 120 for the system appliance, the memory module 160 is mounted on the substrate 120 for the system appliance.

However, in the constructions of the above described prior art memory modules and in the methods of mounting the above mentioned prior art memory modules on the substrate 120 for the system appliance, such drawbacks are incurred that the number of stacking of the semiconductor devices 132 in FIG. 28, the number of stacking of the packages 142 in FIG. 29, the number of stacking of the packages 152 and 154 in FIG. 30 and the number of stacking of the semiconductor chips 163 in the resinous package 162 in FIG. 31 are physically limited and reduction of area for mounting the memory module on the substrate 120 for the system appliance is restricted by size of these semiconductor devices.

SUMMARY OF THE INVENTION

Accordingly, an essential object of the present invention is to provide, with a view to eliminating the above mentioned drawbacks of prior art, a surface mount type stacked semiconductor device structure including a plurality of semiconductor devices, in which space for mounting the semiconductor devices on a system appliance can be reduced and capacity of the semiconductor devices can be increased.

In order to accomplish this object of the present invention, a stacked semiconductor device structure according to the present invention comprises: a plurality of semiconductor modules each of which includes a substrate and at least one semiconductor device mounted on the substrate; a stacking means for stacking the semiconductor modules on one another; and a surface mount means for surface mounting on a further substrate for a system appliance the semiconductor modules stacked on one another by the stacking means.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
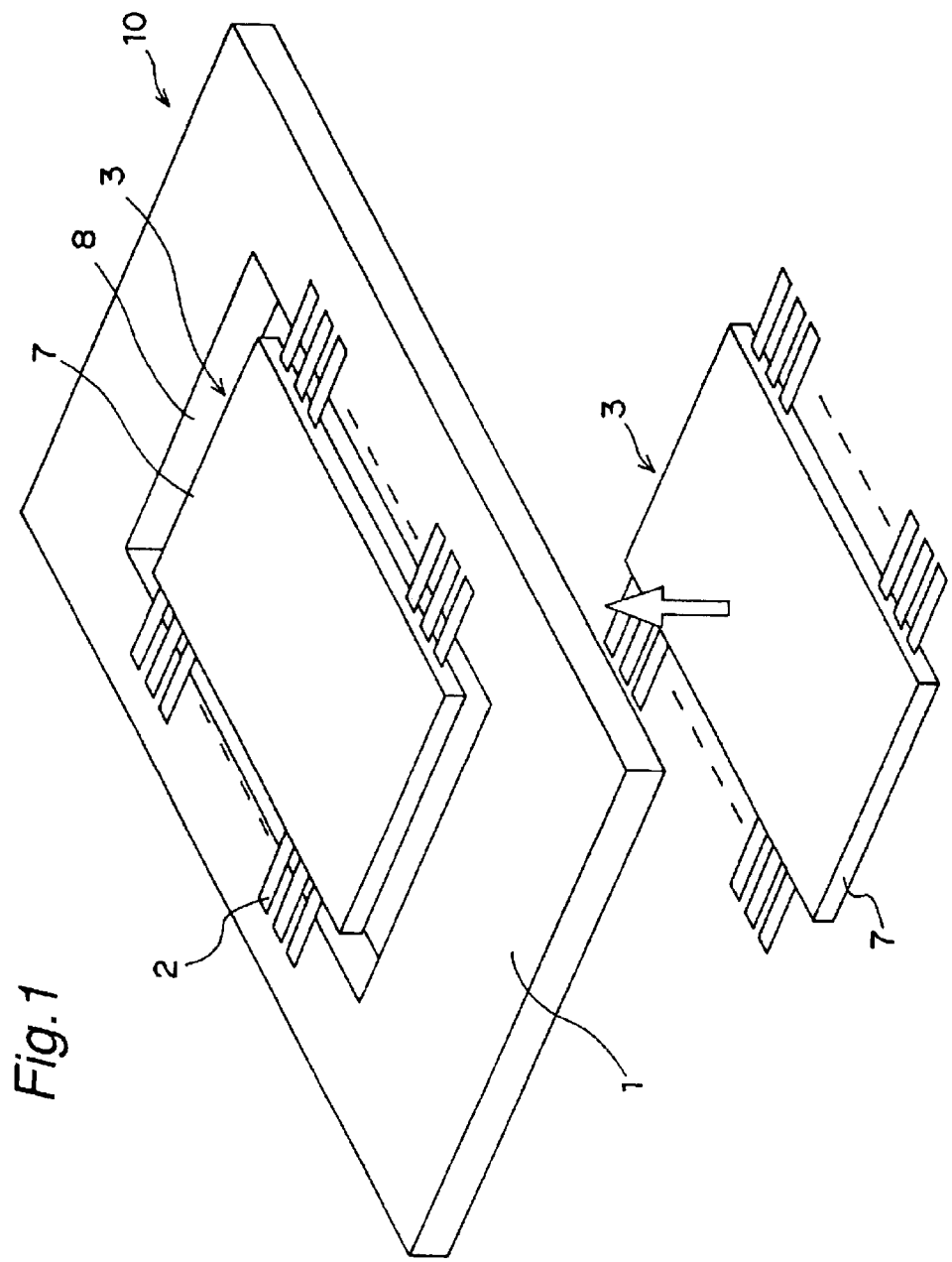
FIG. 1 is a perspective view explanatory of a production method of a semiconductor module employed in a stacked semiconductor device structure according to a first embodiment of the present invention.
Figure 2:
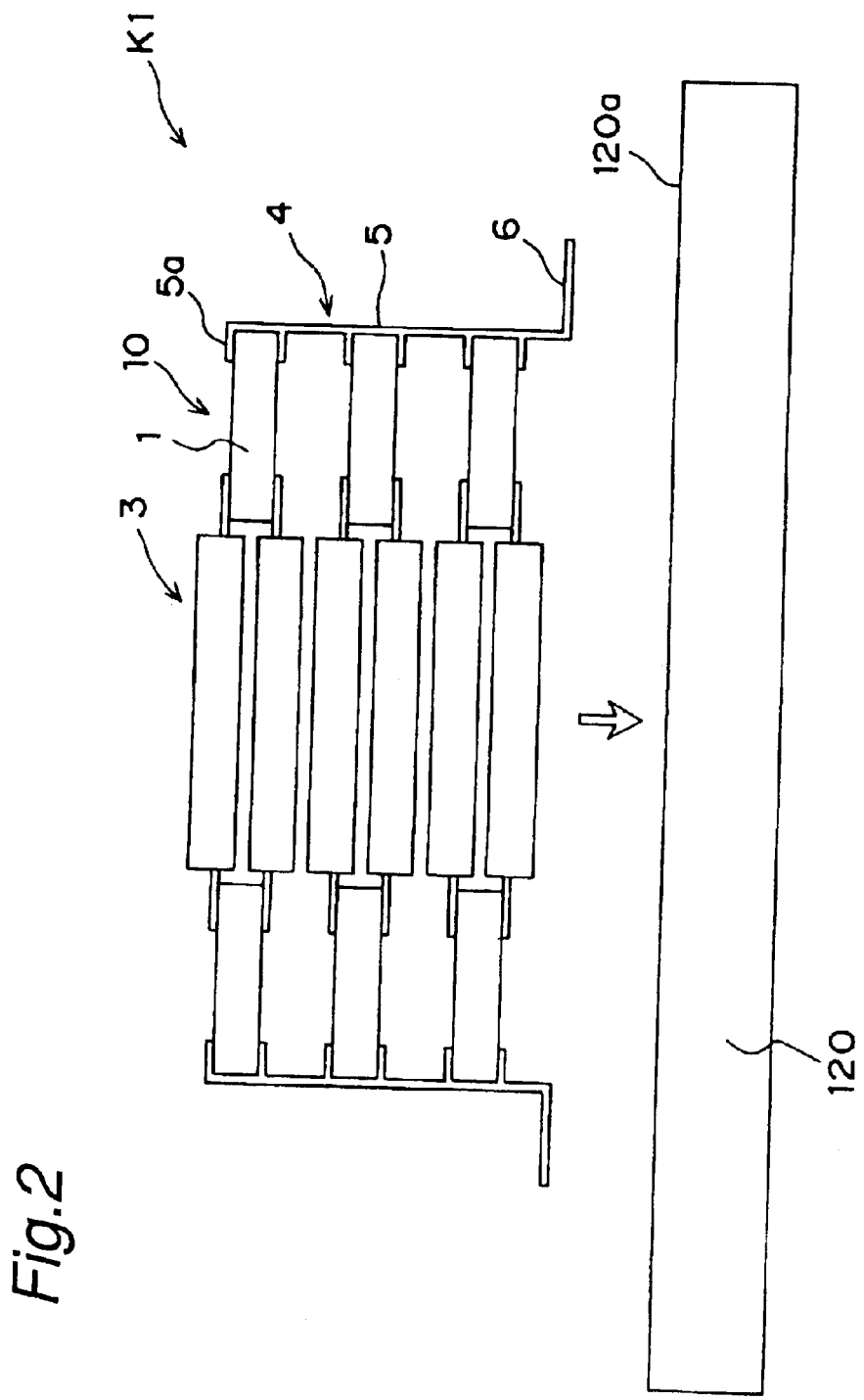
FIG. 2 is a schematic sectional view of the stacked semiconductor device structure of FIG. 1.

FIGS. 1 and 2 are explanatory of an arrangement of a first embodiment of the present invention. In FIG. 1, a semiconductor device 3 includes a package 7 and a plurality of outer leads 2 extending straight horizontally from opposite sides of the package 7, while a semiconductor module 10 includes a substrate 1 and the semiconductor device 3 mounted on each of opposite faces of the substrate 1. In FIG. 2, a stacked semiconductor device structure K1 in which a plurality of the semiconductor modules 10 are supported by a plurality of pairs of clip type leads 4 so as to be stacked on one another is surface mounted on a mounting face 120a of a substrate 120 for a system appliance. In FIG. 1, a through-hole 8 corresponding in size to the package 7 is formed at a central portion of the substrate 1 and the package 7 is disposed in the through-hole 8 of the substrate 1.

Meanwhile, in FIG. 2, opposite side portions of the substrate 1 of each of a plurality of, for example, three semiconductor modules 10 are soldered to a plurality of pairs of the clip type leads 4 so as to be gripped between the clip type leads 4, so that the surface mount type stacked semiconductor device structure K1 is obtained. The clip type lead 4 is substantially L-shaped and includes a vertical clip portion 5 having, for example, three clips 5a for supporting a side portion of each of the three substrates 1 and a horizontal lead portion 6 surface mounted on the mounting face 120a of the substrate 120 for the system appliance.

In this embodiment, since a plurality of the semiconductor modules 10 are supported by the clip type leads 4 so as to be stacked on one another, the stacked semiconductor device structure K1 having large capacity can be materialized in a mounting space similar to that of prior art and the system appliance can be made compact.

Meanwhile, in conventional insertion mount type such as dual inline package (DIP), through-holes for inserting leads therethrough should be provided on the substrate 120 for the system appliance and thus, layout of the whole system appliance is limited. However, in this embodiment, since the surface mount type clip type leads 4 are used, degree of freedom in both wiring and whole layout can be upgraded for the substrate 120 for the system appliance.

(Second Embodiment)

Figure 3:
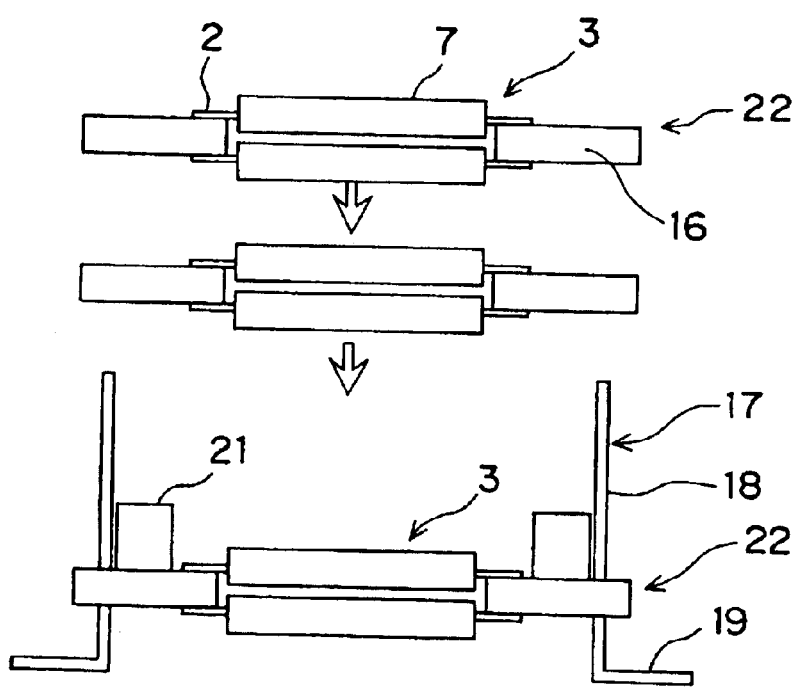
FIG. 3 is a schematic sectional view explanatory of a method of stacking a plurality of semiconductor modules in a stacked semiconductor device structure according to a second embodiment of the present invention.
Figure 4:
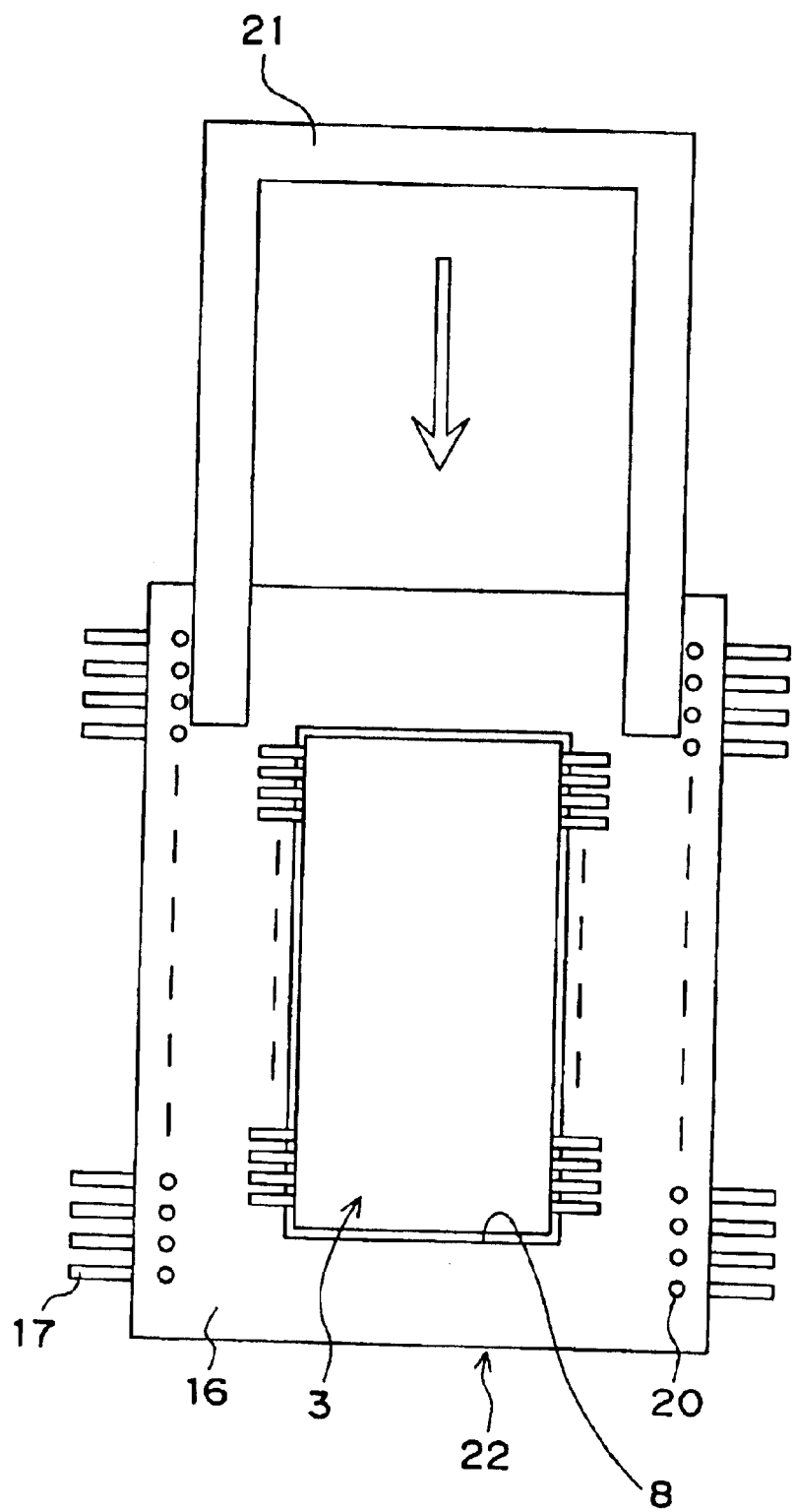
FIG. 4 is a top plan view of FIG. 3.
Figure 5:
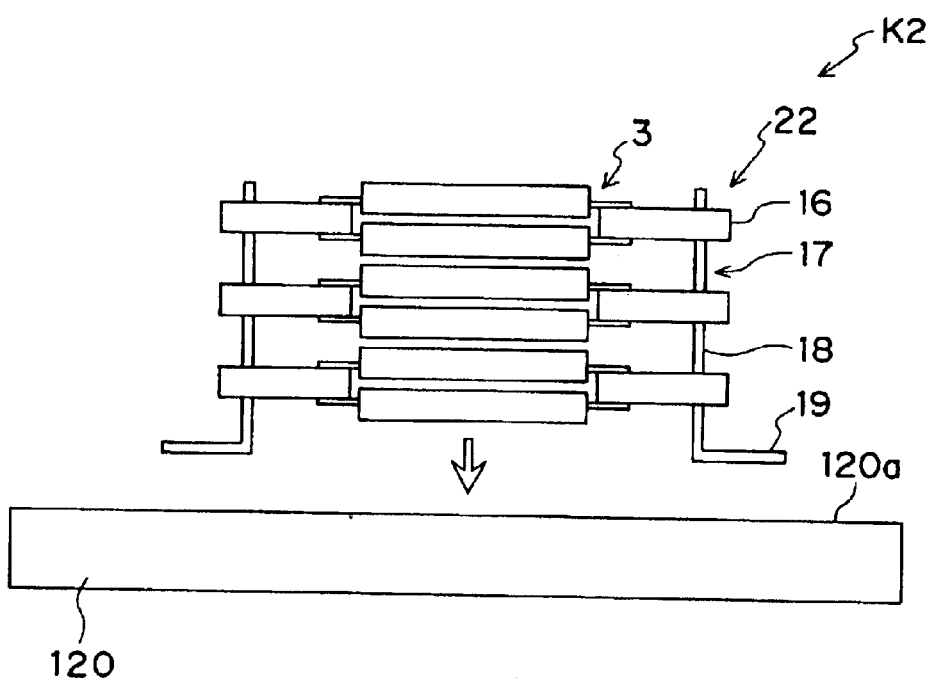
FIG. 5 is a schematic sectional view of the stacked semiconductor device structure of FIG. 3.

FIGS. 3 to 5 are explanatory of an arrangement of a second embodiment of the present invention. In this embodiment, a plurality of semiconductor modules 22 each having the semiconductor device 3 mounted on each of opposite faces of a substrate 16 are supported by a plurality of pairs of pin type leads 17 so as to be stacked on one another as shown in FIG. 5, so that a stacked semiconductor device structure K2 is obtained. This stacked semiconductor device structure K2 is surface mounted on the mounting face 120a of the substrate 120 for the system appliance. Except that a plurality of through-bores 20 for inserting the pin type leads 17 therethrough are formed at opposite side portions of the substrate 16, the substrate 16 is similar to the substrate 1 of the first embodiment. By soldering each substrate 16 to the pin type leads 17 each time the pin type leads 17 have been inserted through the through-bores 20 of each substrate 16, the surface mount type stacked semiconductor device structure K2 is obtained.

The pin type lead 17 is L-shaped and includes a vertical pin portion 18 inserted through the through-bore 20 of the substrate 16 and a horizontal lead portion 19 surface mounted on the mounting face 120a of the substrate 120 for the system appliance. As shown in FIGS. 3 and 4, when the pin type leads 17 are sequentially inserted through the through-bores 20 of the substrate 16 of each of the semiconductor modules 22, a jig 21 is used to not only hold the pin portion 18 vertically but set a distance between neighboring ones of the substrates 16 at a predetermined value. Each time the substrate 16 of one stage has been fixed to the pin type leads 17 in this way, the jig 21 is placed on this substrate 16 and then, the substrate 16 of the next stage is attached to the pin type leads 17 so as to be brought into contact with the jig 21.

In this embodiment, since a plurality of the semiconductor modules 22 are supported by the pin type leads 17 so as to be stacked on one another, the stacked semiconductor device structure K2 having large capacity can be materialized in a mounting space similar to that of prior art and the system appliance can be made compact.

Meanwhile, in conventional insertion mount type, through-holes for inserting leads therethrough should be provided on the substrate 120 for the system appliance and thus, layout of the whole system appliance is limited. However, in this embodiment, since the surface mount type pin type leads 17 are used, degree of freedom in both wiring and whole layout can be upgraded for the substrate 120 for the system appliance.

(Third Embodiment)

Figure 6:
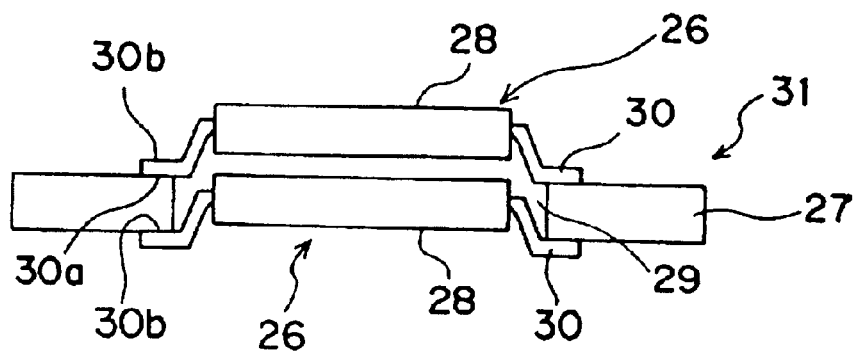
FIG. 6 is a schematic sectional view of a semiconductor module employed in a stacked semiconductor device structure according to a third embodiment of the present invention.

FIG. 6 is a schematic sectional view of a semiconductor module 31. employed in a stacked semiconductor device structure K3 according to a third embodiment of the present invention. In FIG. 6, two semiconductor devices 26 each including a package 28 having gull wing outer leads or L type outer leads 30 are, respectively, mounted on opposite faces of a substrate 27 so as to be oriented in an identical direction such that a semiconductor module 31 is formed. A through-hole 29 corresponding in size to the package 28 is formed at a central portion of the substrate 27. A distal end portion of the L type outer lead 30 has a lower face 30a and an upper face 30b. The lower face 30a of the distal end portion of the L type outer lead 30 of the upper semiconductor device 26 is secured to the upper face of the substrate 27, while the upper face 30b of the distal end portion of the L type outer lead 30 of the lower semiconductor device 26 is secured to the lower face of the substrate 27. Therefore, the lower semiconductor device 26 is mounted on the substrate 27 so as to be oriented in the identical direction and thus, the package 28 of the lower semiconductor device 26 is fitted into the through-hole 29.

When a plurality of the semiconductor modules 31 are supported by the clip type leads 4 of the first embodiment or the pin type leads 17 of the second embodiment, the surface mount type stacked semiconductor device structure having large capacity is obtained. Meanwhile, also in case a plurality of semiconductor modules each of which is obtained by removing the upper semiconductor device 26 from the semiconductor module 31 are supported by the clip type leads 4 of the first embodiment or the pin type leads 17 of the second embodiment, the surface mount type stacked semiconductor device structure having large capacity is likewise obtained.

In this embodiment, since the lower semiconductor device 26 is mounted on the substrate 27 so as to be oriented in the direction identical with that of the upper semiconductor device 26 such that the package 28 of the lower semiconductor device 26 is fitted into the through-hole 29 of the substrate 27, an interval from the mounting face 120a (FIG. 2) of the substrate 120 for the system appliance to each substrate 27 can be lessened.

Meanwhile, in this embodiment, an overall stacking thickness of a plurality of the semiconductor devices 31 can be reduced.

(Fourth Embodiment)

Figure 7:
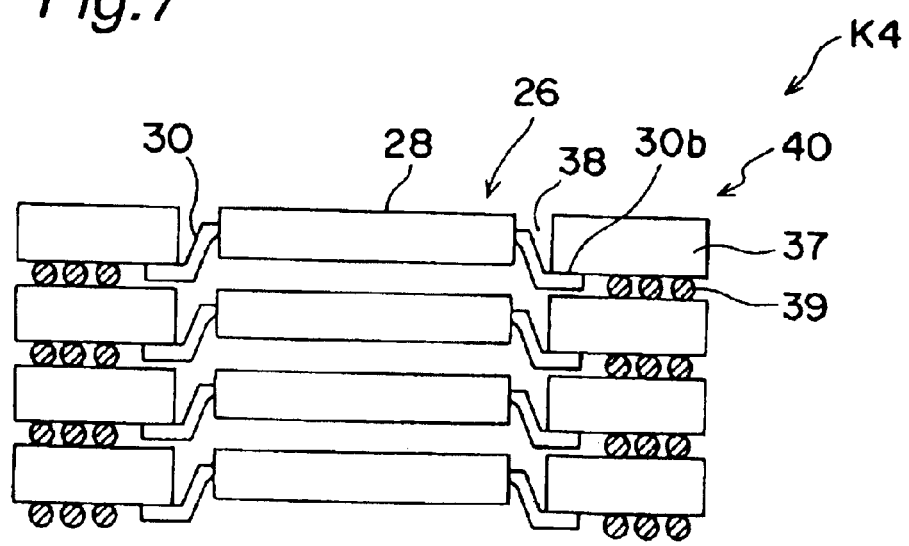
FIG. 7 is a schematic sectional view of a stacked semiconductor device structure according to a fourth embodiment of the present invention.

FIG. 7 shows a stacked semiconductor device structure K4 according to a fourth embodiment of the present invention. In FIG. 7, the upper face 30b of the distal end portion of the L type outer lead 30 of the semiconductor device 26 is fixed to only the lower face of a substrate 37 such that a semiconductor module 40 is formed. When a plurality of the semiconductor modules 40 are supported by solder balls 39 provided on the lower face of the substrate 37 so as to be stacked on one another, the surface mount type stacked semiconductor device structure K4 having large capacity is obtained.

In this embodiment, since the upper face 30b of the distal end portion of the L type outer lead 30 of the semiconductor device 26 is attached to the lower face of the substrate 37, the package 28 is fitted into a through-hole 38 of the substrate 37, an interval from the mounting face 120a of the substrate 120 for the system appliance to each substrate 37 can be lessened.

Meanwhile, in this embodiment, an overall stacking thickness of a plurality of the semiconductor modules 30 can be reduced.

(Fifth Embodiment)

Figure 8:
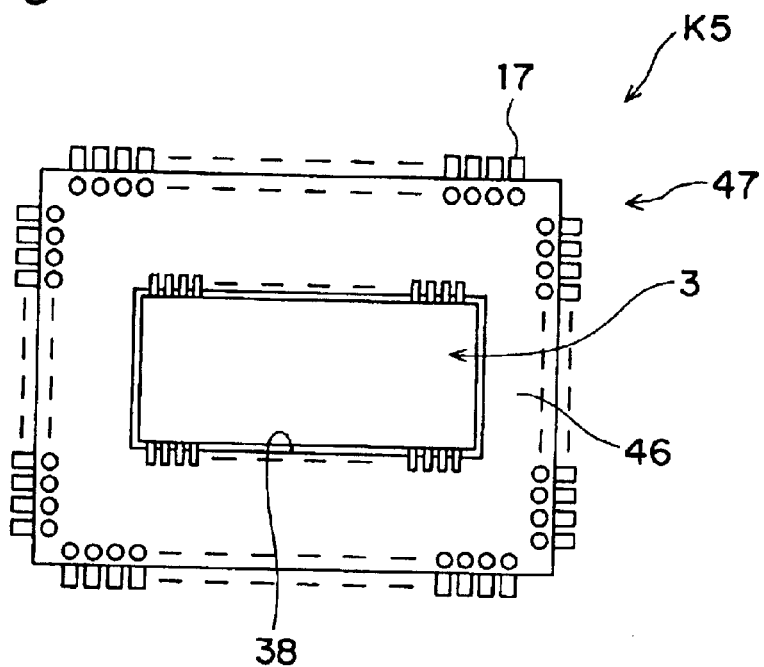
FIG. 8 is a schematic top plan view of a stacked semiconductor device structure according to a fifth embodiment of the present invention.

FIG. 8 is a top plan view of a stacked semiconductor device structure K5 according to a fifth embodiment of the present invention. The clip type leads 4 of the first embodiment and the pin type leads 17 of the second embodiment are provided at only the opposite sides of the substrate. On the other hand, in the stacked semiconductor device structure K5, the clip type leads 4 or the pin type leads 17 are provided at four sides of a substrate 46. In FIG. 8, the pin type leads 17 are provided.

When a plurality of semiconductor modules 47 are supported by the clip type leads 4 or the pin type leads 17 so as to be stacked on one another, the surface mount type stacked semiconductor device structure K5 having large capacity is obtained.

In this embodiment, since the number of the clip type leads 4 or the pin type leads 17 can be increased, input and output signals can be increased, so that the stacked semiconductor device structure K5 having large capacity is obtained.

Meanwhile, in this embodiment, since area of the substrate 46 can be reduced, area for mounting the stacked semiconductor device structure K5 on the mounting face 120a of the substrate 120 for the system appliance is minimized.

(Sixth Embodiment)

Figure 9:
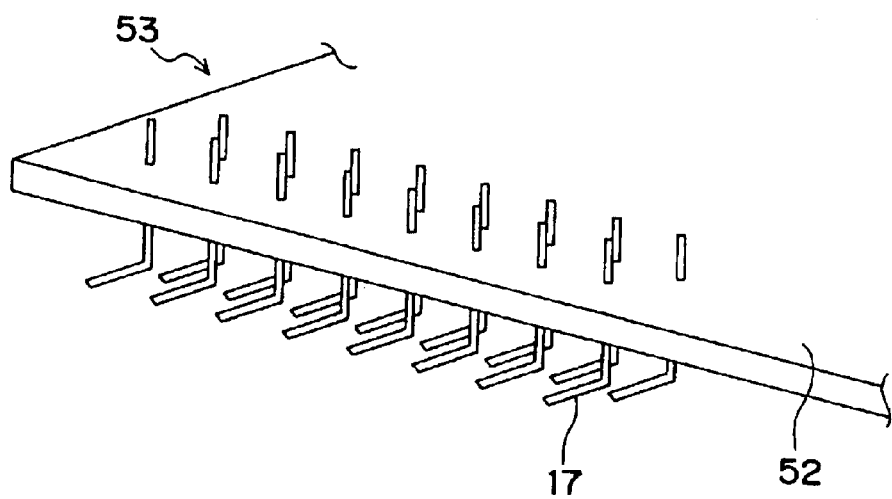
FIG. 9 is a fragmentary perspective view showing a semiconductor module and a plurality of pin type leads employed in a stacked semiconductor device structure according to a sixth embodiment of the present invention.

FIG. 9 shows a semiconductor module 53 and a plurality of the pin type leads 17 for supporting the semiconductor module 53 in a stacked semiconductor device structure K6 according to a sixth embodiment of the present invention. In the semiconductor module 53, the pin type leads 17 are inserted through four side portions of a substrate 52 in the same manner as the fifth embodiment and are arranged zigzag in two rows at each side portion of the substrate 52. As a result, pitch of the pin type leads 17 on the substrate 52 can be made smaller than that of the fifth embodiment.

When a plurality of the semiconductor modules 53 are supported by the pin type leads 17 so as to be stacked on one another, the surface mount type stacked semiconductor device structure K6 having large capacity can be obtained.

In this embodiment, since the number of the pin type leads 17 inserted through the substrate 52 can be increased, input and output signals can be increased, so that the stacked semiconductor device structure K6 having large capacity can be obtained.

Meanwhile, in this embodiment, since area of the substrate 52 can be reduced, area for mounting the stacked semiconductor device structure K6 on the mounting face 120a of the substrate 120 for the system appliance is minimized.

(Seventh Embodiment)

Figure 10:
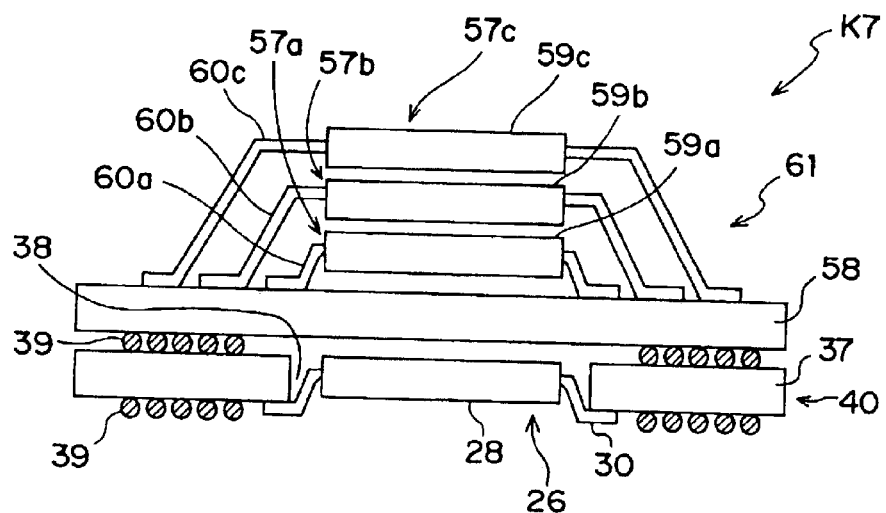
FIG. 10 is a schematic sectional view of a stacked semiconductor device structure according to a seventh embodiment of the present invention.

FIG. 10 shows a stacked semiconductor device structure K7 according to a seventh embodiment of the present invention. In the stacked semiconductor device structure K7, a semiconductor device 61 is formed by mounting a semiconductor devices 57a, 57b and 57c on an upper face of a substrate 58, while the substrate 37 of the semiconductor module 40, on whose lower face the semiconductor device 26 is mounted in the fourth embodiment, is attached to a lower face of the substrate 58 by the solder balls 39. The semiconductor devices 57a, 57b and 57c include packages 59a, 59b and 59c having L type outer leads 60a, 60b and 60c whose lengths become sequentially larger in this order, respectively. Since the solder balls 39 are provided also on a lower face of the substrate 37, the surface mount type stacked semiconductor device structure K7 having large capacity is obtained.

Meanwhile, also in case the semiconductor module 61 is stacked on the semiconductor module 40 by the clip type leads 4 of the first embodiment or the pin type leads 17 of the second embodiment in place of the solder balls 39, the surface mount type stacked semiconductor device structure K7 having large capacity is obtained.

In this embodiment, since the semiconductor module 61 is stacked on the semiconductor module 40, the stacked semiconductor device structure K7 having large capacity can be materialized in a mounting space similar to that of a prior art semiconductor device, so that the system appliance can be made compact.

Meanwhile, in conventional insertion mount type, through-holes for inserting leads therethrough should be provided on the substrate 120 for the system appliance and thus, layout of the whole system appliance is limited. However, in this embodiment, by specification of ball grid array (BGA) of a surface mount type package, degree of freedom in both wiring and whole layout can be upgraded for the substrate 120 for the system appliance.

(Eighth Embodiment)

Figure 11:
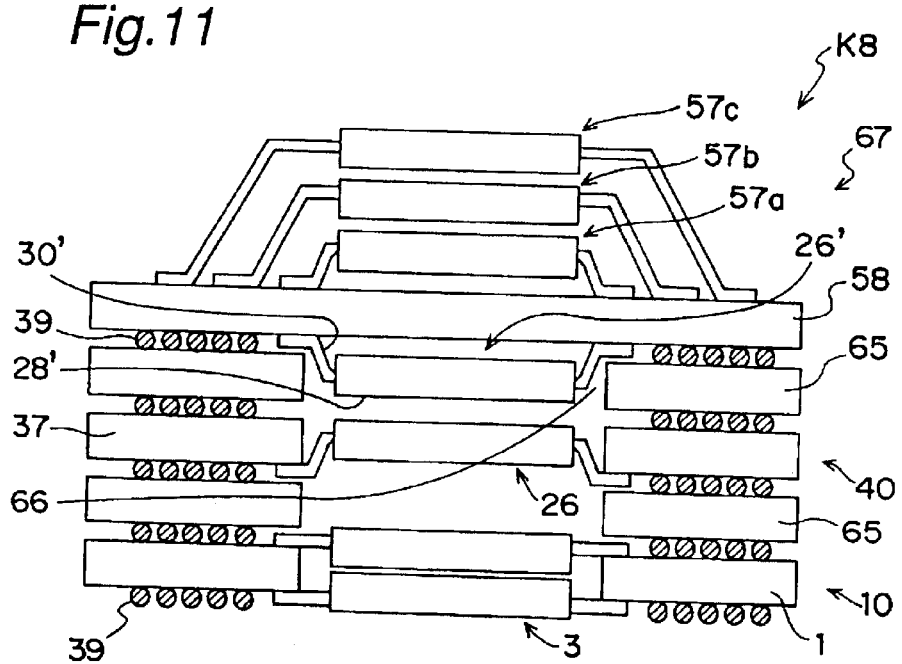
FIG. 11 is a schematic sectional view of a stacked semiconductor device structure according to an eighth embodiment of the present invention.

FIG. 11 shows a stacked semiconductor device structure K8 according to an eighth embodiment of the present invention. In the stacked semiconductor device structure K8, the semiconductor devices 57a, 57b and 57c are mounted on the upper face of the substrate 58 and a semiconductor device 26' is mounted on the lower face of the substrate 58 so as to be oriented in a direction opposite to that of the semiconductor device 57a such that a semiconductor module 67 is formed. Meanwhile, the lower face of the substrate 58 is connected by the solder balls 39, via an interconnection substrate 65 formed with only a wiring pattern, with the substrate 37 of the semiconductor module 40 of the fourth embodiment, on whose lower face the semiconductor device 26 is mounted such that a package 28' of the semiconductor device 26' is fitted into a through-hole 66 of the interconnection substrate 65. Furthermore, the substrate 37 referred to above is connected by the solder balls, through another interconnection substrate 65 formed with only the wiring pattern, with the substrate 1 of the semiconductor module 10 of the first embodiment, on each of whose opposite faces the semiconductor devices 3 is mounted. By providing the solder balls 39 on the lower face of the substrate 1, the surface mount type stacked semiconductor device structure K8 having large capacity is obtained. Meanwhile, the solder balls 39 may be replaced by solder paste.

In this embodiment, since the semiconductor modules 67, 40 and 10 are stacked on one another by way of the interconnection substrates 65, the stacked semiconductor device structure K8 having large capacity can be materialized in a mounting space similar to that of a prior art semiconductor device, so that the system appliance can be made compact.

Meanwhile, in conventional insertion mount type, through-holes for inserting leads therethrough should be provided on the substrate 120 for the system appliance and thus, layout of the whole system appliance is limited. However, in this embodiment, by specification of BGA of a surface mount type package, degree of freedom in both wiring and whole layout can be upgraded for the substrate 120 for the system appliance.

(Ninth Embodiment)

Figure 12:
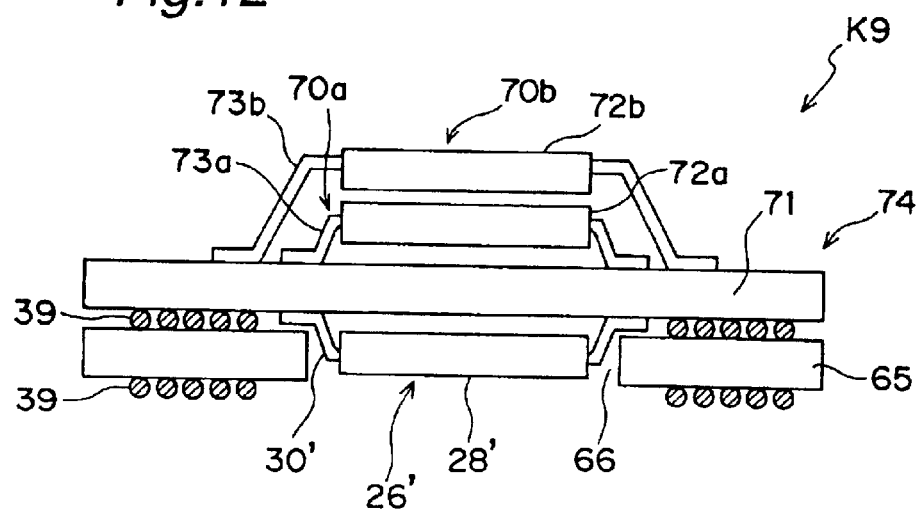
FIG. 12 is a schematic sectional view of a stacked semiconductor device structure according to a ninth embodiment of the present invention.

FIG. 12 shows a stacked semiconductor device structure K9 according to a ninth embodiment of the present invention. In the stacked semiconductor device structure K9, semiconductor devices 70a and 70b are mounted on an upper face of a substrate 71 and the semiconductor device 26' is mounted on a lower face of the substrate 71 by L type outer leads 30' so as to be oriented in a direction opposite to that of the semiconductor device 70a such that a semiconductor module 74 is formed. Meanwhile, the lower face of the substrate 71 is fixed to the interconnection substrate 65 of the eighth embodiment by the solder balls 39 such that the package 28' of the semiconductor device 26' is fitted into the through-hole 66 of the interconnection substrate 65. The semiconductor devices 70a and 70b include packages 72a and 72b having L type outer leads 73a and 73b whose lengths become sequentially larger in this order, respectively. Since the solder balls 39 are provided also on the lower face of the interconnection substrate 65, the surface mount type stacked semiconductor device structure K9 having large capacity is obtained. The solder balls 39 may be replaced by solder paste.

In this embodiment, since a stand-off height can be secured between the package 28' of the semiconductor device 26' and the mounting face 120a of the substrate 120 for the system appliance when the interconnection substrate 65 attached to the lower face of the substrate 71 of the semiconductor module 74 is connected with the substrate 120 for the system appliance, degree of freedom in three-dimensional mounting of the stacked semiconductor device structure K9 on the substrate 120 for the system appliance is upgraded and capacity of the stacked semiconductor device structure K9 can be increased easily.

(Tenth Embodiment)

Figure 13:
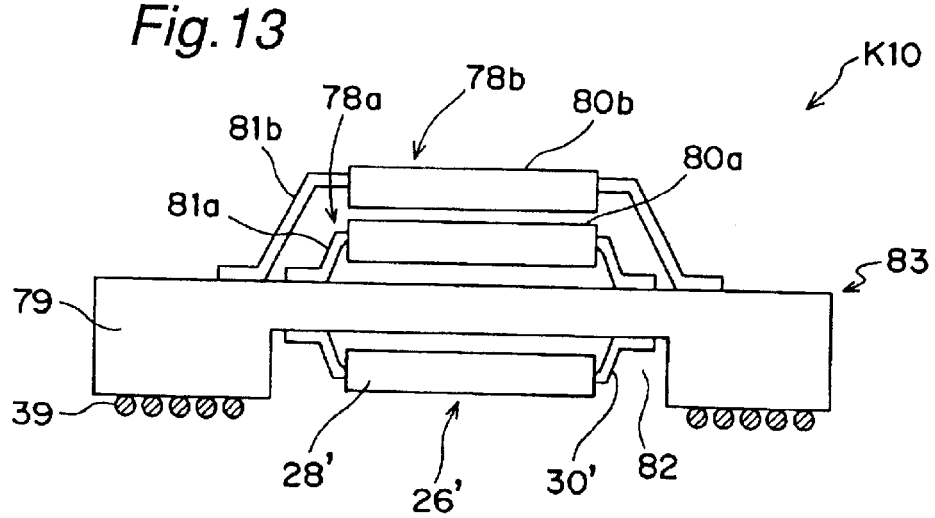
FIG. 13 is a schematic sectional view of a stacked semiconductor device structure according to a tenth embodiment of the present invention.

FIG. 13 shows a semiconductor module 83 employed in a stacked semiconductor device structure K10 according to a tenth embodiment of the present invention. In the stacked semiconductor device structure K9, semiconductor devices 78a and 78b are mounted on an upper face of a substrate 79 and the semiconductor device 26' is mounted on a bottom of a recess 82 of a lower face of the substrate 79 by the L type outer leads 30' in a direction opposite to that of the semiconductor device 78a so as to be accommodated in the recess 82 such that the semiconductor module 83 is formed. The semiconductor devices 78a and 78b include packages 80a and 80b having L type outer leads 81a and 81b whose lengths become sequentially larger in this order, respectively. By providing the solder balls 39 on the lower face of the substrate 79, the surface mount type stacked semiconductor device structure K10 having large capacity is obtained.

In FIG. 13, the stacked semiconductor device structure K10 is constituted by the single semiconductor module 83. However, a plurality of the semiconductor modules 83 may be stacked on one another by the interconnection substrates 65 and the solder balls 39 as illustrated in the eighth embodiment or the ninth embodiment.

In this embodiment, since the semiconductor device 26' is accommodated in the recess 82 on the lower face of the substrate 79, a stand-off height can be secured between the package 28' of the semiconductor device 26' and the mounting face 120a of the system 120 for the system appliance, so that the stacked semiconductor device structure K10 can be easily surface mounted on the substrate 120 for the system appliance.

(Eleventh Embodiment)

Figure 14:
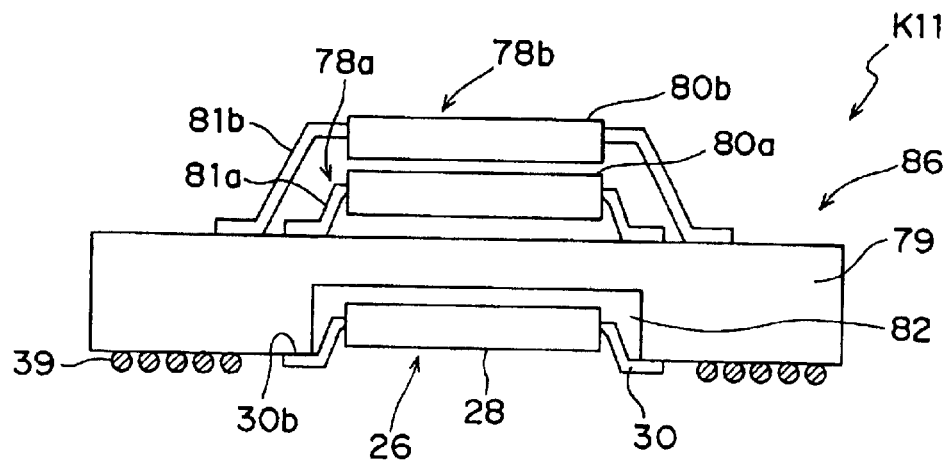
FIG. 14 is a schematic sectional view of a stacked semiconductor device structure according to an eleventh embodiment of the present invention.

FIG. 14 shows a semiconductor module 86 employed in a stacked semiconductor device structure K11 according to an eleventh embodiment of the present invention. The semiconductor module 86 is similar to the semiconductor module 83 of the tenth embodiment. In the semiconductor module 86, the semiconductor device 26 is employed in place of the semiconductor device 26' of the semiconductor module 83 and the package 28 of the semiconductor device 26 is fitted into the recess 82 by attaching the upper face 30b of the distal end portion of the L type outer lead 30 of the semiconductor device 26 to the lower face of the substrate 79. Since other constructions of the semiconductor module 86 are identical with those of the semiconductor module 83, the description is abbreviated for the sake of brevity. By providing the solder balls 39 on the lower face of the substrate 79, the surface mount type stacked semiconductor device structure K11 having large capacity is obtained.

In FIG. 14, the stacked semiconductor device structure K11 is constituted by the single semiconductor module 86. However, a plurality of the semiconductor modules 86 may be stacked on one another by the interconnection substrates 65 and the solder balls 39 as illustrated in the eighth embodiment or the ninth embodiment.

In this embodiment, since the package 28 of the semiconductor device 26 is fitted into the recess 82 on the lower face of the substrate 79, a stand-off height can be secured between the package 28 of the semiconductor device 26 and the mounting face 120a of the system 120 for the system appliance, so that the stacked semiconductor device structure K11 can be easily surface mounted on the substrate 120 for the system appliance.

(Twelfth Embodiment)

Figure 15:
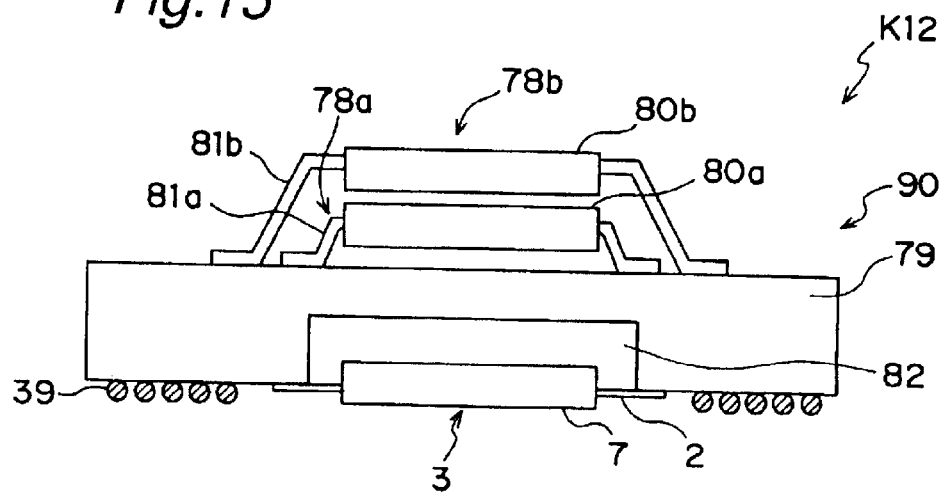
FIG. 15 is a schematic sectional view of a stacked semiconductor device structure according to a twelfth embodiment of the present invention.

FIG. 15 shows a semiconductor module 90 employed in a stacked semiconductor device structure K12 according to a twelfth embodiment of the present invention. The semiconductor module 90 is similar to the semiconductor module 83 of the tenth embodiment. In the semiconductor module 90, the semiconductor device 3 of the first embodiment is employed in place of the semiconductor device 26' of the semiconductor module 83 and the package 7 of the semiconductor device 3 partially sinks into the recess 82 by fixing the outer leads 2 of the semiconductor device 3 to the lower face of the substrate 79. Since other constructions of the semiconductor module 90 are identical with those of the semiconductor module 83, the description is abbreviated for the sake of brevity. By providing the solder balls 39 on the lower face of the substrate 79, the surface mount type stacked semiconductor device structure K12 having large capacity is obtained.

In FIG. 15, the stacked semiconductor device structure K12 is constituted by the single semiconductor module 90. However, a plurality of the semiconductor modules 90 may be stacked on one another by the interconnection substrates 65 and the solder balls 39 as illustrated in the eighth embodiment or the ninth embodiment.

In this embodiment, since the outer leads 2 extending straight horizontally from the package 7 of the semiconductor device 3 are secured to the lower face of the substrate 79 such that the package 7 partially sinks into the recess 82 of the substrate 79, a stand-off height can be secured between the package 7 of the semiconductor device 3 and the mounting face 120a of the system 120 for the system appliance, so that the stacked semiconductor device structure K12 can be easily surface mounted on the substrate 120 for the system appliance.

(Thirteenth Embodiment)

Figure 16:
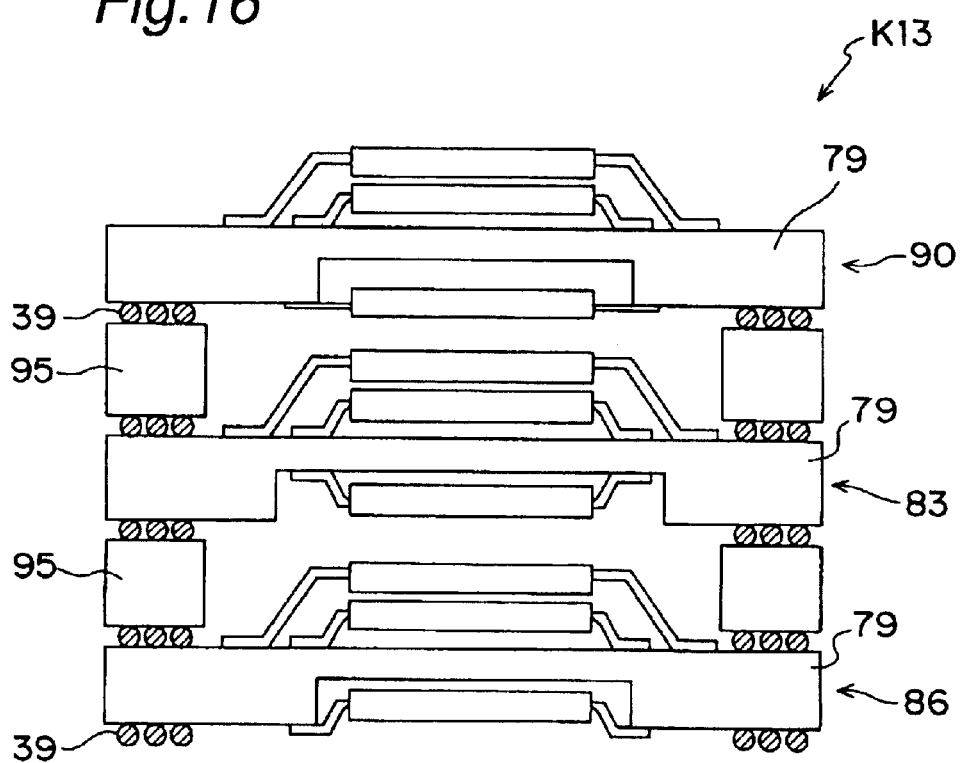
FIG. 16 is a schematic sectional view of a stacked semiconductor device structure according to a thirteenth embodiment of the present invention.

FIG. 16 shows a stacked semiconductor device structure K13 according to a thirteenth embodiment of the present invention. In the stacked semiconductor device structure K13, the semiconductor module 90 of the twelfth embodiment, the semiconductor module 83 of the tenth embodiment and the semiconductor module 86 of the eleventh embodiment are sequentially stacked on one another in this order from above via interconnection substrates 95 each formed with only a wiring pattern by the solder balls 39 or solder paste. By providing the solder balls 39 on the lower face of the substrate 79 of the lowermost semiconductor module 86, the surface mount type stacked semiconductor device structure K13 having large capacity is obtained.

Meanwhile, the surface mount type stacked semiconductor device structure K13 having large capacity may also be obtained by utilizing a stacking method of the first embodiment or the second embodiment.

In this embodiment, since the semiconductor modules 90, 83 and 86 are stacked on one another through the interconnection substrates 95, the stacked semiconductor device structure K13 having large capacity can be materialized in a mounting space similar to that of a prior art semiconductor device, so that the system appliance can be made compact.

Meanwhile, in conventional insertion mount type, through-holes for inserting leads therethrough should be provided on the substrate 120 for the system appliance and thus, layout of the whole system appliance is limited. However, in this embodiment, by specification of BGA of a surface mount type package, degree of freedom in both wiring and whole layout can be upgraded for the substrate 120 for the system appliance.

(Fourteenth Embodiment)

Figure 17:
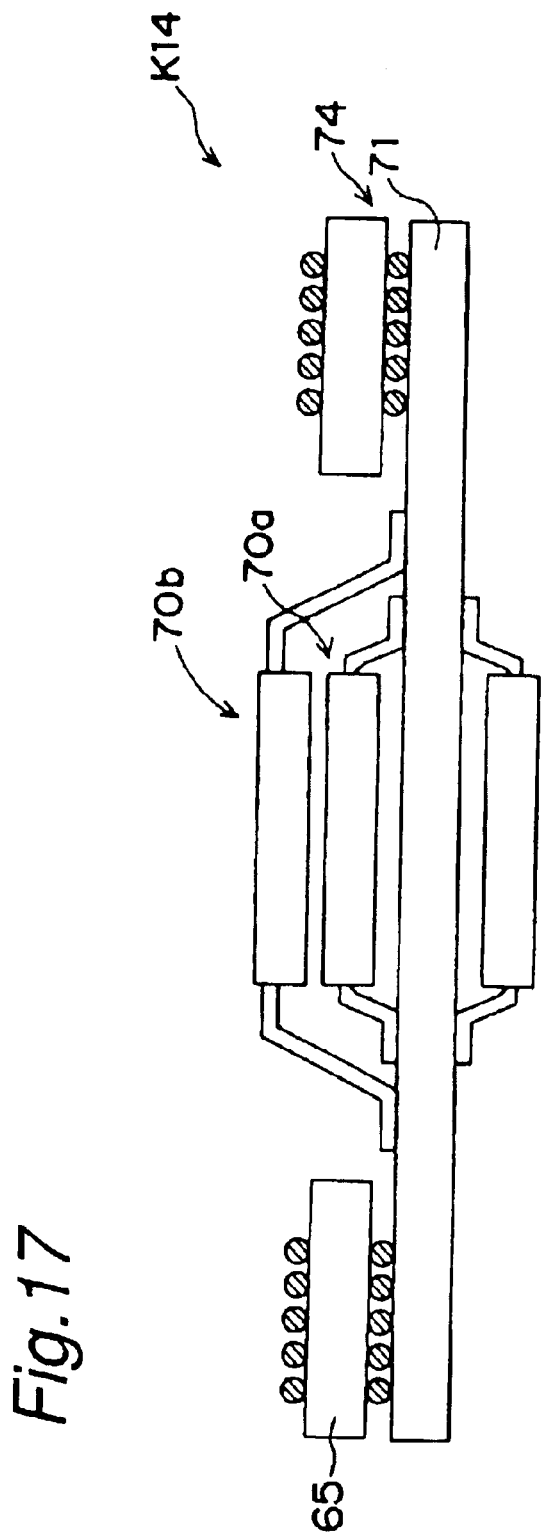
FIG. 17 is a schematic sectional view of a stacked semiconductor device structure according to a fourteenth embodiment of the present invention.

FIG. 17 shows a stacked semiconductor device structure K14 according to a fourteenth embodiment of the present invention. The stacked semiconductor device structure K14 is similar to the stacked semiconductor device structure K9 of the ninth embodiment. In the stacked semiconductor device structure K14, the interconnection substrate 65 formed with only the wiring pattern is attached to the upper face of the substrate 71 of the semiconductor module 74 in contrast with the stacked semiconductor device structure K9 in which the interconnection substrate 65 is attached to the lower face. Since other constructions of the stacked semiconductor device structure K14 is identical with those of the stacked semiconductor device structure K9, the description is abbreviated for the sake of brevity. As a result, layout of signal lines of the stacked semiconductor device structure K14 and that of the stacked semiconductor device structure K9 are of complete symmetry.

Figure 18:
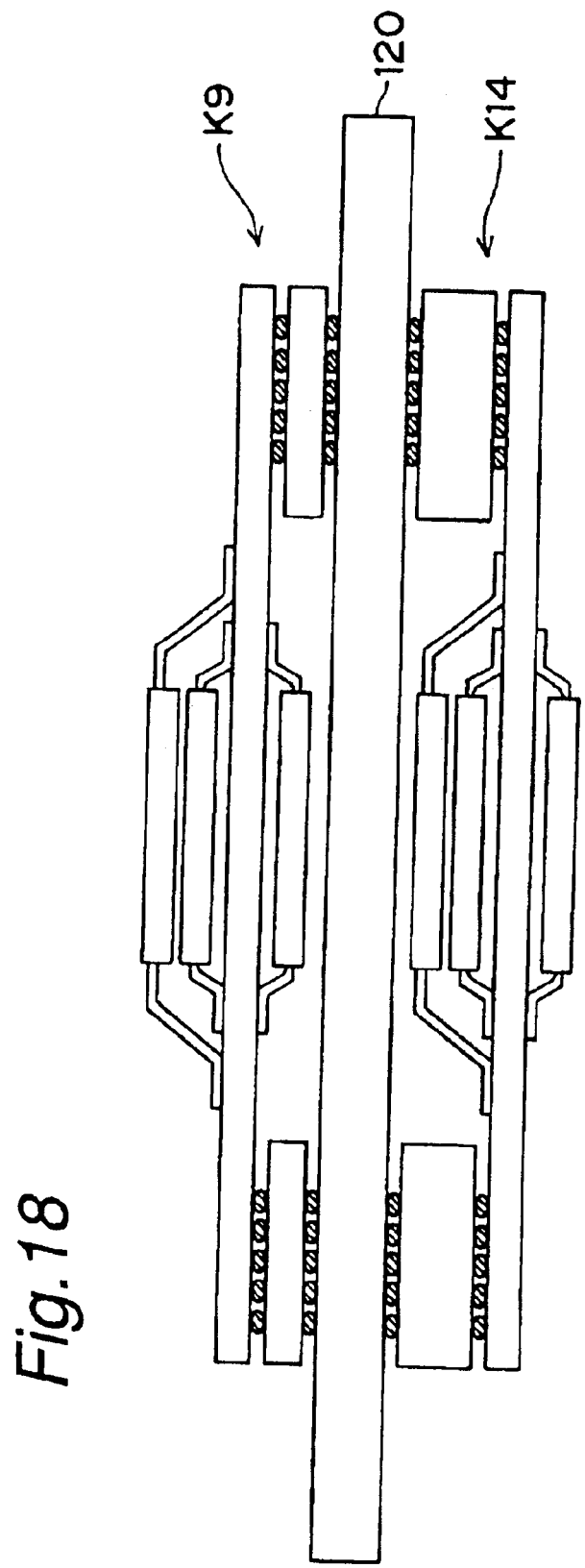
FIG. 18 is a schematic sectional view showing the stacked semiconductor device structures of FIGS. 12 and 17, which are mounted on opposite faces of a substrate for a system appliance, respectively.

In this embodiment, layout of the signal lines of the stacked semiconductor device structure K14 and that of the stacked semiconductor device structure K9 are of complete symmetry. Hence, in case the stacked semiconductor device structures K9 and K14 are mounted on opposite faces of the substrate 120 for the system appliance as shown in FIG. 18, signal lines are not required to be laid on the substrate 120 for the system appliance, so that wiring design of the substrate 120 for the system appliance is facilitated.

(Fifteenth Embodiment)

Figure 19:
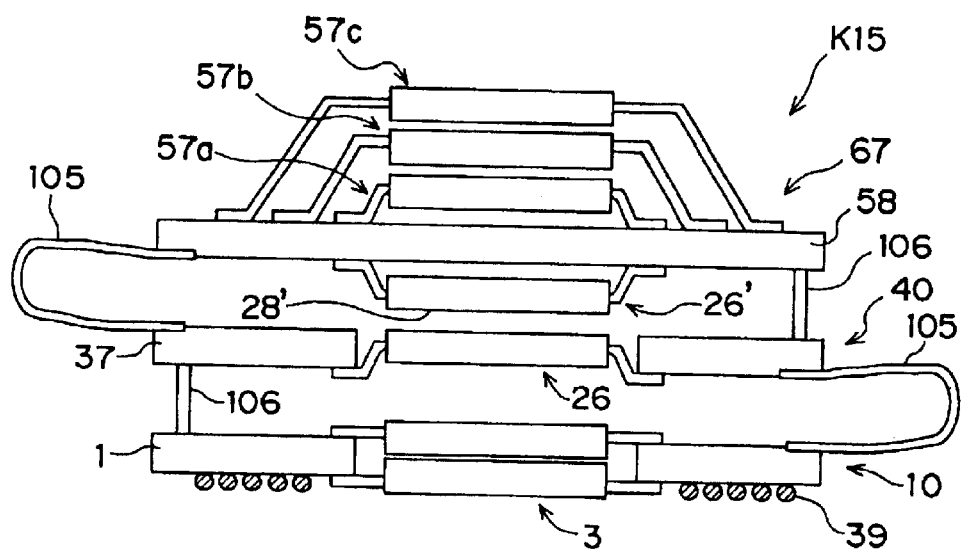
FIG. 19 is a schematic sectional view of a stacked semiconductor device structure according to a fifteenth embodiment of the present invention.
Figure 20:
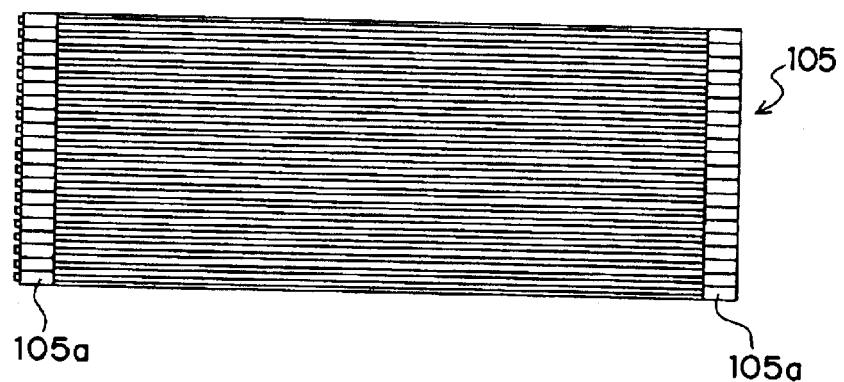
FIG. 20 is a top plan view of a flexible wiring board employed in the stacked semiconductor device structure of FIG. 19.

FIG. 19 shows a stacked semiconductor device structure K15 according to a fifteenth embodiment of the present invention. In the stacked semiconductor device structure K15, the semiconductor module 67 of the eighth embodiment, the semiconductor module 40 of the fourth embodiment and semiconductor module 40 of the first embodiment are sequentially stacked on one another in this order from above via flexible wiring boards 105 and fixing pins 106. As shown in FIG. 20, the flexible wiring board 105 is subjected to wiring and has a connecting pad 105a at each of its opposite ends. At one side of the semiconductor modules 67, 40 and 10, the flexible wiring board 105 is interposed between neighboring ones of these semiconductor modules. Meanwhile, at the other side of the semiconductor modules 67, 40 and 10, the fixing pin 106 is interposed between neighboring ones of these semiconductor modules so as to secure an interval between the neighboring ones of the semiconductor modules.

In this embodiment, since the semiconductor modules 67, 40 and 10 are stacked on one another by way of the flexible wiring boards 105 and the fixing pins 106, the stacked semiconductor device structure K15 having large capacity can be materialized in a mounting space similar to that of a prior art semiconductor device, so that the system appliance can be made compact.

Meanwhile, in conventional insertion mount type, through-holes for inserting leads therethrough should be provided on the substrate 120 for the system appliance and thus, layout of the whole system appliance is limited. However, in this embodiment, by specification of BGA of a surface mount type package, degree of freedom in both wiring and whole layout can be upgraded for the substrate 120 for the system appliance.

(Sixteenth Embodiment)

Figure 21:
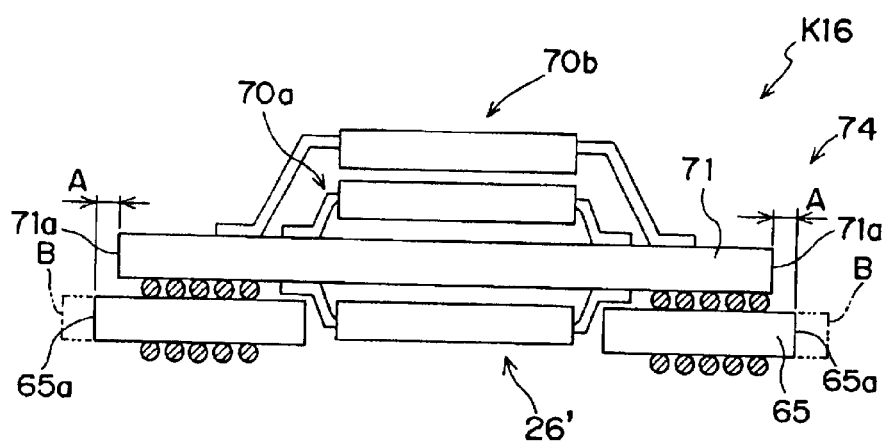
FIG. 21 is a schematic sectional view of a stacked semiconductor device structure according to a sixteenth embodiment of the present invention.

FIG. 21 shows a stacked semiconductor device structure K16 according to a sixteenth embodiment of the present invention. The stacked semiconductor device structure K16 is similar to the stacked semiconductor device structure K9 of the ninth embodiment. During a production process of the stacked semiconductor device structure K16, after the semiconductor devices 70a, 70b and 26' have been mounted on the substrate 71 of the semiconductor module 74, the substrate 71 is fixed to a panel blank in which a plurality of the interconnection substrates 65 each formed with only the wiring pattern are provided integrally. Then, opposite side portions B of the panel blank of the interconnection substrates 65 are cut off along cutting lines 65a so as to obtain the interconnection substrate 65. At this time, each of opposite sides 71a of the substrate 71 is preliminarily spaced a dimension A inwardly from the cutting line 65a of the panel blank of the interconnection substrates 65 such that the substrate 71 is not cut during cutting of the panel blank of the interconnection substrates 65. Since other constructions of the stacked semiconductor device structure K16 are identical with those of the stacked semiconductor device structure K9, the description is abbreviated for the sake of brevity.

In this embodiment, since the each of the opposite sides 71a of the substrate 71 is preliminarily spaced the dimension A inwardly from the cutting line 65a of the panel blank of the interconnection substrates 65, the substrate 71 is not cut during cutting of the panel blank of the interconnection substrates 65, so that cutting operation of the interconnection substrates 65 is performed accurately and efficiently.

(Seventeenth Embodiment)

Figure 22:
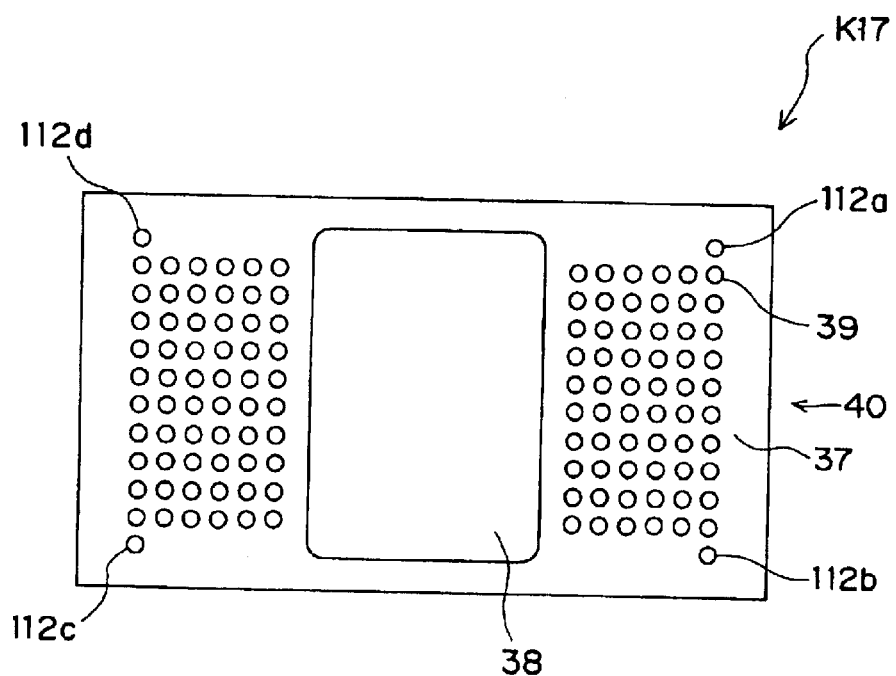
FIG. 22 is a view showing an array of solder balls on a substrate in a stacked semiconductor device structure according to a seventeenth embodiment of the present invention.

FIG. 22 shows a rectangular array of the solder balls 39 on the lower face of the substrate 37 of the semiconductor module 40 in a stacked semiconductor device structure K17 according to a seventeenth embodiment of the present invention. The stacked semiconductor device structure K17 is similar to the stacked semiconductor device structure K7 of the seventh embodiment. In the stacked semiconductor device structure K17, dummy solder balls 112a, 112b, 112c and 112d are, respectively, provided outside four corners of the rectangular array of the solder balls 39 on the lower face of the substrate 37. Since other constructions of the stacked semiconductor device structure K17 are identical with those of the stacked semiconductor device structure K7, the description is abbreviated for the sake of brevity.

In this embodiment, since the dummy solder balls 112a to 112d provided outside the four corners of the rectangular array of the solder balls 39, respectively undergo external force earlier than the solder balls 39 so as to protect the solder balls from the external force, the solder balls 39 are least likely to be detached from the substrate 37, so that reliability of the solder balls 39 is raised.

(Eighteenth Embodiment)

Figure 23:
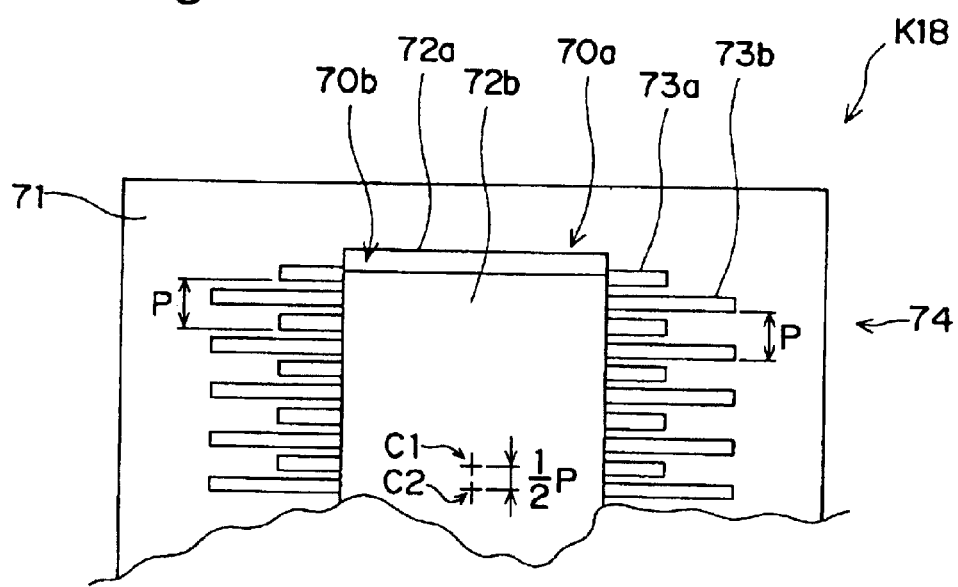
FIG. 23 is a view showing a disposition of L type outer leads of a semiconductor device on a substrate in a stacked semiconductor device structure according to an eighteenth embodiment of the present invention.

FIG. 23 shows a disposition of the L type outer leads 73a and 73b on the upper face of the substrate 71 of the semiconductor module 74 in a stacked semiconductor device structure K18 according to an eighteenth embodiment of the present invention. The stacked semiconductor device structure K18 is similar to the stacked semiconductor device K9 of the ninth embodiment. In the stacked semiconductor device structure K18, both the L type outer leads 73a and 73b are arranged at a pitch P and a center C1 of the lower package 72a and a center C2 of the upper package 72b are spaced a half of the pitch P from each other such that the L type outer leads 73a and 73b do not overlap each other. Since other constructions of the stacked semiconductor device structure K18 are identical with those of the stacked semiconductor device structure K9, the description is abbreviated for the sake of brevity.

In this embodiment, since the center C1 of the lower package 72a and the center C2 of the upper package 72b are spaced the half of the pitch P of the L type outer leads 73a and 73b from each other, the L type outer leads 73a of the lower package 72a are visible between the L type outer leads 73b of the upper package 72b, so that visual inspection of the L type outer leads 73a of the lower package 72a is facilitated.

(Nineteenth Embodiment)

Figure 24:
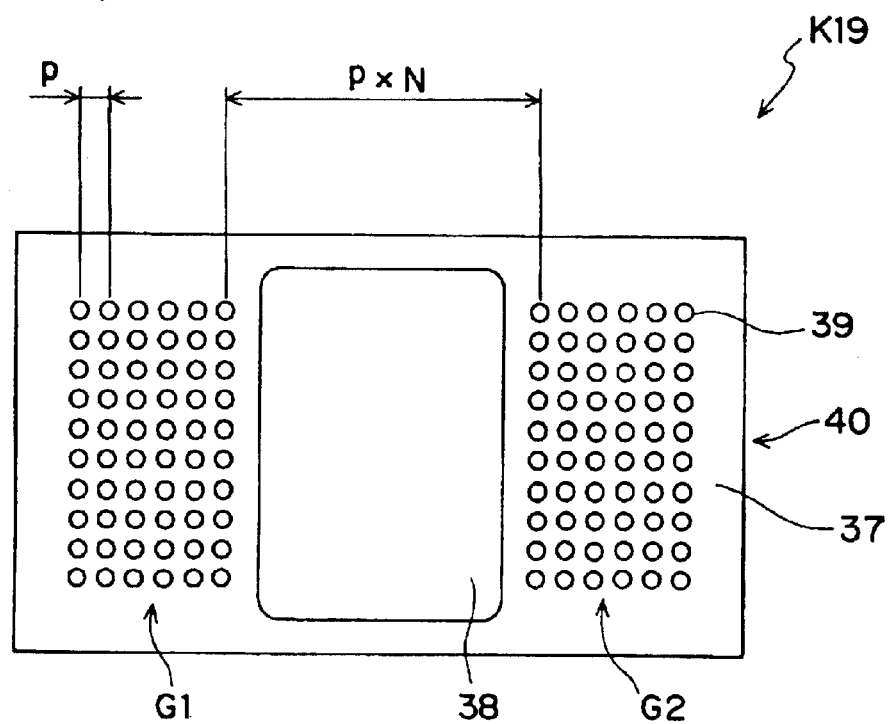
FIG. 24 is a view showing an array of solder balls on a substrate in a stacked semiconductor device structure according to a nineteenth embodiment of the present invention.

FIG. 24 shows an array of the solder balls 39 on the lower face of the substrate 37 of the semiconductor module 40 in a stacked semiconductor device structure K19 according to a nineteenth embodiment of the present invention. The stacked semiconductor device structure K19 is similar to the stacked semiconductor device structure K7 of the seventh embodiment. In rectangular first and second groups G1 and G2 of the solder balls 39 in the stacked semiconductor device structure K19, the solder balls 39 are arranged in a checked pattern at a pitch p on the lower face of the substrate 37 and an interval between a rightward end column of the first group G1 of the solder balls 39 and a leftward end column of the second group G2 of the solder balls 39 is set at a product of the pitch p and an integer N, i.e., (p×N).

In this embodiment, since the interval between the first and second groups G1 and G2 of the solder balls 39 is set at the product of the pitch p of the solder balls 39 and the integer N, each of the whole solder balls 39 on the substrate 37 occupies a position spaced a product of the pitch p and an integer from a leftward end column of the first group G1 of the solder balls 39, so that design of the substrate 120 for the system appliance is facilitated and mounting accuracy can be maintained even if the interval between the first and second groups G1 and G2 of the solder balls 39 deviates from its manufacturing tolerance.

(Twentieth Embodiment)

Figure 25:
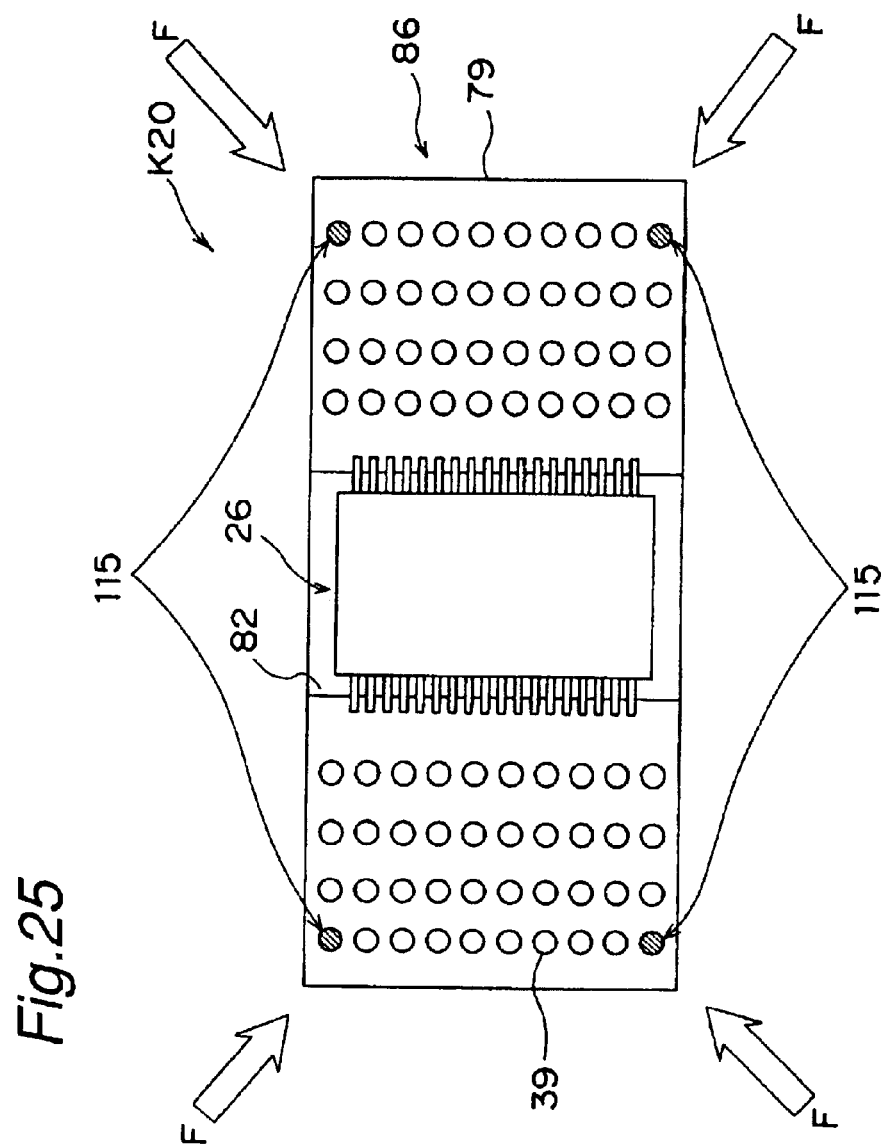
FIG. 25 is a view showing an array of solder balls on a substrate in a stacked semiconductor device structure according to a twentieth embodiment of the present invention.

FIG. 25 shows an array of the solder balls 39 on the lower face of the substrate 79 of the semiconductor module 86 in a stacked semiconductor device structure K20 according to a twentieth embodiment of the present invention. The stacked semiconductor device structure K20 is similar to the stacked semiconductor device structure K11 of the eleventh embodiment. As shown in FIG. 25, a dummy solder ball 115 held out of electrical contact with a mating face of the system appliance soldered to the lower face of the substrate 79 is provided at each of four corners of an outermost frame of a whole group of the solder balls 39 arranged in a checked pattern. By this arrangement, when external forces F are applied to the stacked semiconductor device structure K20, stress is initially concentrated at the dummy solder balls 115. However, even if deterioration of the dummy solder balls 115 held out of electrical contact with the mating face of the system appliance progresses, malfunction does not occur.

In this embodiment, since the dummy solder balls 115 held out of electrical contact with the mating face of the system appliance undergo the external forces F initially, the solder balls 39 held in electrical contact with the mating face of the system appliance are protected from the external forces F, so that malfunction due to deterioration of the solder balls 39 is least likely to occur. As a result, it is possible to secure long-term mounting reliability of the stacked semiconductor device structure K20 which is mounted on the system appliance by using the solder balls 39.

Figure 26:
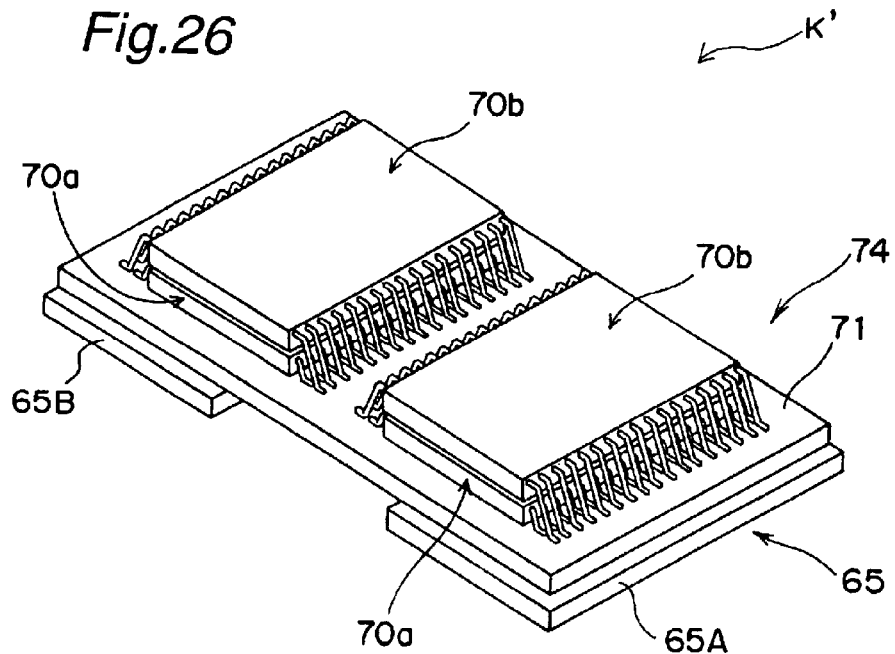
FIG. 26 is a perspective view of a modified stacked semiconductor device structure of the present invention as observed from above.
Figure 27:
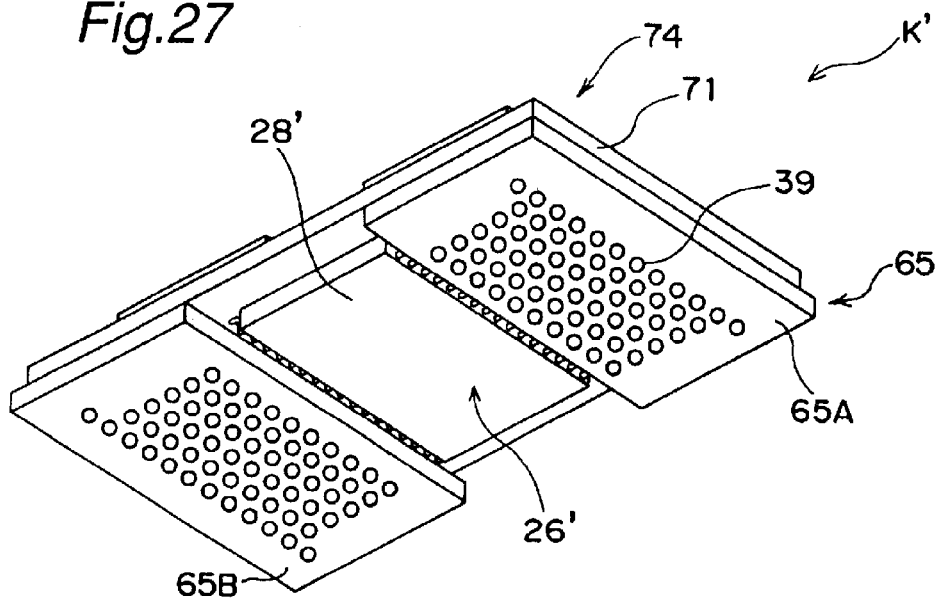
FIG. 27 is a perspective view of the modified stacked semiconductor device structure of FIG. 26 as observed from below.
Figure 28:
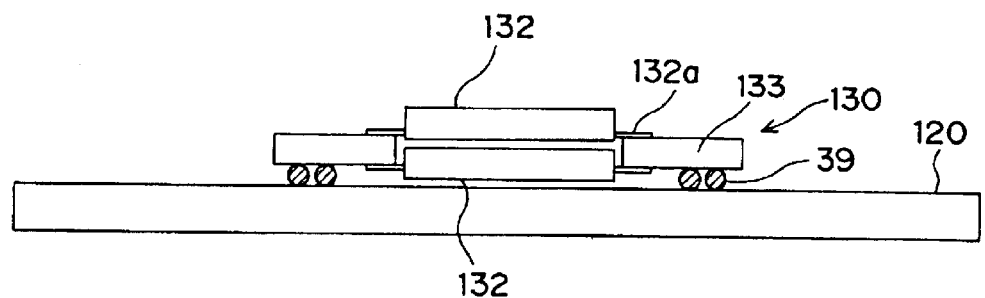
FIG. 28 is a schematic sectional view showing a first example of a prior art memory module.
Figure 29:
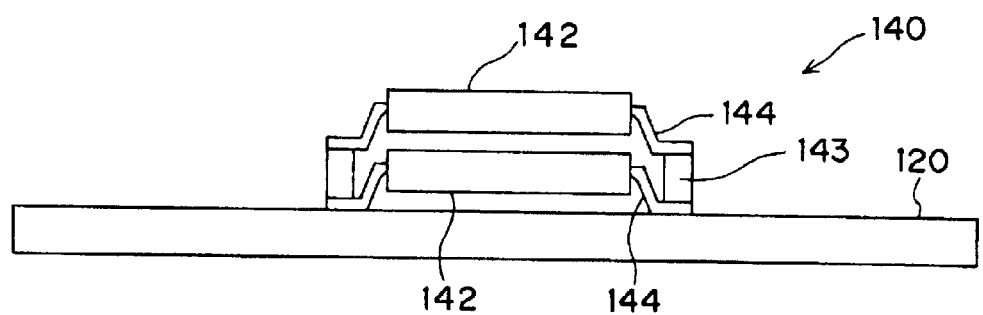
FIG. 29 is a schematic sectional view showing a second example of the prior art memory module.
Figure 30:
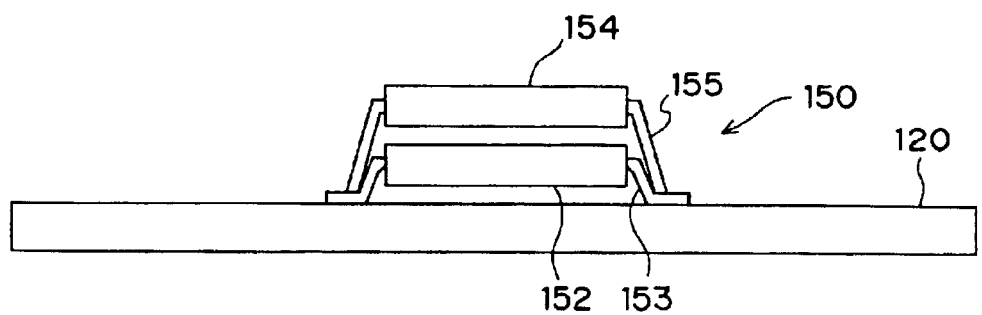
FIG. 30 is a schematic sectional view showing a third example of the prior art memory module.
Figure 31:
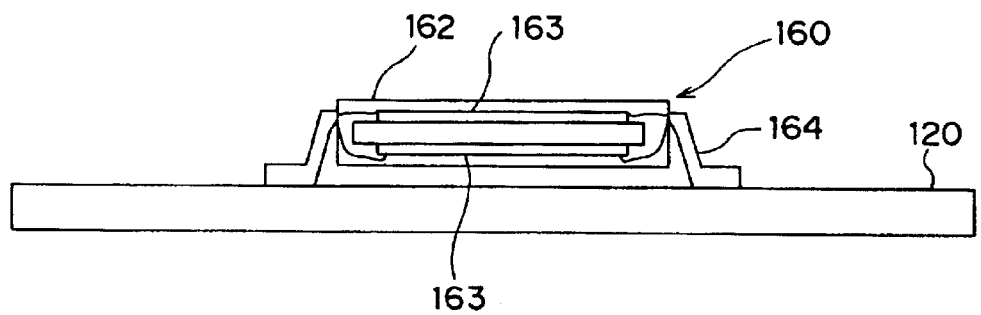
FIG. 31 is a schematic sectional view showing a fourth example of the prior art memory module.

In the foregoing first to twentieth embodiments, the through-hole is formed at the substantially central portion of each of the substrates 1, 16, 27, 37, 46, 52, 65 and 95 including the interconnection substrates 65 and 95 so as to receive the package of the semiconductor device. However, each of these substrates 1, 16, 27, 37, 46, 52, 65 and 95 may be instead split into a plurality of substrate sections such that the package of the semiconductor device is fitted into a clearance between neighboring ones of the substrate sections. For example, in a modified stacked semiconductor device structure K of the present invention shown in FIGS. 26 and 27, the substrate 65 is split into substrate sections 65A and 65B in an arrangement similar to that of the ninth embodiment and the package 28' of the semiconductor device 26' is fitted into a clearance between the substrate sections 65A and 65B spaced away from each other.

As is clear from the foregoing description, the following marked effects (1) to (20) can be gained in the stacked semiconductor device structure of the present invention.

(1) Since the stacked semiconductor device structure comprises: a plurality of the semiconductor modules each of which includes the substrate and at least one semiconductor device mounted on the substrate; the stacking means for stacking the semiconductor modules on one another; and the surface mount means for surface mounting on the further substrate for the system appliance the semiconductor modules stacked on one another by the stacking means, space for mounting a plurality of the semiconductor devices on the system appliance is reduced and capacity of the semiconductor devices can be increased.

(2) Since the stacking means and the surface mount means are constituted by the clip type leads, a plurality of the semiconductor modules are supported by the clip type leads so as to be stacked on one another, so that a large-capacity stacked semiconductor device structure can be materialized in a mounting space similar to that of prior art and the system appliance can be made compact.

Furthermore, by using the surface mount type clip type leads, degree of freedom in both wiring and whole layout can be upgraded for the substrate for the system appliance.

(3) Since the stacking means and the surface mount means are constituted by the pin type leads, a plurality of the semiconductor modules are supported by the pin type leads so as to be stacked on one another, so that a large-capacity stacked semiconductor device structure can be materialized in a mounting space similar to that of prior art and the system appliance can be made compact.

Furthermore, by using the surface mount type pin type leads, degree of freedom in both wiring and whole layout can be upgraded for the substrate for the system appliance.

(4) Since the stacking means includes the solder balls provided between the substrates of neighboring ones of the semiconductor modules, an interval from the mounting face of the substrate for the system appliance to each substrate can be lessened and an overall stacking thickness of a plurality of the semiconductor modules can be reduced.

(5) Since the stacking means includes the interconnection substrate formed with only the wiring pattern and having the through-hole and the interconnection substrate is provided between the substrates of neighboring ones of the semiconductor modules such that the semiconductor device is partially fitted into the through-hole, a large-capacity stacked semiconductor device structure can be materialized in a mounting space similar to that of a conventional semiconductor device, so that the system appliance can be made compact.

Furthermore, degree of freedom in both wiring and whole layout can be upgraded for the substrate for the system appliance.

(6) Since the stacking means includes the interconnection substrate formed with only the wiring pattern and split into a plurality of the substrate sections and the interconnection substrate is provided between the substrates of neighboring ones of the semiconductor modules such that the semiconductor device is partially fitted into the clearance between neighboring ones of the substrate sections, a large-capacity stacked semiconductor device structure can be materialized in a mounting space similar to that of a conventional semiconductor device, so that the system appliance can be made compact.

Furthermore, degree of freedom in both wiring and whole layout can be upgraded for the substrate for the system appliance.

(7) Since the stacking means includes the flexible wiring board and the fixing pin provided between the substrates of neighboring ones of the semiconductor modules, a large-capacity stacked semiconductor device structure can be materialized in a mounting space similar to that of a conventional semiconductor device, so that the system appliance can be made compact.

Furthermore, by specification of BGA of a surface mount type package, degree of freedom in both wiring and whole layout can be upgraded for the substrate for the system appliance.

(8) Since the surface mount means includes the solder balls provided beneath the substrate of a lowermost one of the semiconductor modules, an interval from the mounting face of the substrate for the system appliance to each substrate can be lessened and an overall stacking thickness of a plurality of the semiconductor modules can be reduced.

(9) Since the surface mount means includes the interconnection substrate formed with only the wiring pattern and having the through-hole and the interconnection substrate is provided under the substrate of the lowermost one of the semiconductor modules such that the semiconductor device is partially fitted into the through-hole, degree of freedom in three-dimensional mounting of the stacked semiconductor device structure on the substrate for the system appliance is upgraded and capacity of the stacked semiconductor device structure can be increased easily.

(10) Since the surface mount means includes the interconnection substrate formed with only the wiring pattern and split into a plurality of substrate sections and the interconnection substrate is provided under the substrate of the lowermost one of the semiconductor modules such that the semiconductor device is partially fitted into the clearance between neighboring ones of the substrate sections, degree of freedom in three-dimensional mounting of the stacked semiconductor device structure on the substrate for the system appliance is upgraded and capacity of the stacked semiconductor device structure can be increased easily.

(11) Since the solder balls are arranged in the rectangular array and the dummy solder ball is provided outside each of four corners of the rectangular array of the solder balls, the dummy solder balls undergo external force earlier than the solder balls so as to protect the solder balls from the external force, so that the solder balls are least likely to be detached from the substrate and thus, reliability of the solder balls is raised.

(12) Since the distance between one of the solder balls and each of the remaining ones of the solder balls is set at a product of a desired pitch and an integer, design of the system for the system appliance is facilitated and mounting accuracy can be maintained easily.

(13) Since the substrate is formed with the recess such that the semiconductor device is partially fitted into the recess, the stacked semiconductor device structure can be surface mounted on the substrate for the system appliance easily.

(14) Since the substrate is formed with the through-hole such that the semiconductor device is partially fitted into the through-hole, an interval from the mounting face of the substrate for the system appliance to each substrate can be lessened and an overall stacking thickness of a plurality of the semiconductor modules can be reduced.

(15) Since the substrate is split into a plurality of the substrate sections such that the semiconductor device is partially fitted into the clearance between neighboring ones of the substrate sections, an interval from the mounting face of the substrate for the system appliance to each substrate can be lessened and an overall stacking thickness of a plurality of the semiconductor modules can be reduced.

(16) Since in one of the semiconductor modules, the semiconductor device includes the package and a plurality of the L-shaped leads for mounting the package on the substrate and the upper face of the distal end portion of each of the L-shaped leads is attached to the lower face of the substrate, an interval from the mounting face of the substrate for the system appliance to each substrate can be lessened and an overall stacking thickness of a plurality of the semiconductor modules can be reduced.

(17) Since in one of the semiconductor modules, a plurality of the semiconductor devices are mounted on the substrate and each include the package and a plurality of the leads for mounting the package on the substrate such that the leads of the semiconductor devices are arranged at an identical pitch; wherein centers of the packages of the semiconductor devices are spaced an interval not more than the pitch from one another; visual inspection of the leads of a plurality of the semiconductor devices is facilitated.

(18) Since the stacked semiconductor device structure comprises: the semiconductor module which includes the substrate and a plurality of the semiconductor devices mounted on the substrate; and the interconnection substrate which is formed with only the wiring pattern and is provided under the substrate, degree of, freedom in three-dimensional mounting of the stacked semiconductor device structure on the substrate for the system appliance is upgraded and capacity of the stacked semiconductor device structure can be increased easily.

(19) Since the outer contour of the substrate of the semiconductor module as observed from above is surrounded by the outer contour of the interconnection substrate as observed from above, cutting operation of the interconnection substrates is performed accurately and efficiently.

(20) Since the stacked semiconductor device structure comprises: the semiconductor module which includes the substrate formed with the recess and a plurality of the semiconductor devices mounted on the substrate; and the surface mount means for surface mounting the semiconductor module on the further substrate for the system appliance such that one of the semiconductor devices is fitted into the recess, the stacked semiconductor device structure can be surface mounted on the substrate for the system appliance easily.

What is claimed is:

1. A stacked semiconductor device structure, comprising:
   a semiconductor module which includes a substrate having a principal surface and its opposite surface, at least one first semiconductor device mounted on the principal surface of the substrate and at least one second semiconductor device mounted on the opposite surface of the substrate; and
   an interconnection means which has a princinal surface and its opposite surface and is formed with an opening such that principal surface of the interconnection means is mounted on an other area of the opposite surface of the substrate semiconductor module than that for mounting the second semiconductor device, wherein
   an outer contour of the interconnection means is larger than that of the substrate of the semiconductor module.

2. A stacked semiconductor device structure according to claim 1, wherein the interconnection means has a through-hole such that the semiconductor device is partially fitted into the through-hole.

3. A stacked semiconductor device structure according to claim 2, further comprising solder balls provided beneath the interconnection means, wherein the solder balls are arrange in a rectangular array and a dummy solder ball is provided outside each of four corners of the rectangular array of the solder balls.

4. A stacked semiconductor device structure according to claim 2, further comprising solder balls provided beneath the interconnection means, wherein a distance between one of the solder balls and each of the remaining ones of the solder balls is set at a product of a desired pitch and an integer.

5. A stacked semiconductor device structure according to claim 1, wherein the interconnection means is split into a plurality of substrate sections such that the semiconductor device is partially fitted into a clearance between neighboring ones of the substrate sections.

6. A stacked semiconductor device structure according to claim 5, further comprising solder balls provided beneath the interconnection means, wherein the solder balls are arrange in a rectangular array and a dummy solder ball is provided outside each of four corners of the rectangular array of the solder balls.

7. A stacked semiconductor device structure according to claim 5, further comprising solder balls provided beneath the interconnection means, wherein a distance between one of the solder balls and each of the remaining ones of the solder balls is set at a product of a desired pitch and an integer.

* * * * *